(12) United States Patent
Cho

(10) Patent No.: US 11,664,330 B2
(45) Date of Patent: May 30, 2023

(54) SEMICONDUCTOR PACKAGE

(71) Applicant: Samsung Electronics Co., Ltd., Suwon-si (KR)

(72) Inventor: Kyong Soon Cho, Incheon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/220,495

(22) Filed: Apr. 1, 2021

(65) Prior Publication Data

US 2021/0225782 A1 Jul. 22, 2021

Related U.S. Application Data

(63) Continuation of application No. 16/109,766, filed on Aug. 23, 2018, now Pat. No. 10,978,409.

(30) Foreign Application Priority Data

Dec. 28, 2017 (KR) .......................... 10-2017-0182025

(51) Int. Cl.
*H01L 23/00* (2006.01)
*H01L 25/065* (2023.01)
(Continued)

(52) U.S. Cl.
CPC ............ *H01L 23/562* (2013.01); *H01L 23/16* (2013.01); *H01L 23/3128* (2013.01);
(Continued)

(58) Field of Classification Search
CPC ... H01L 23/562; H01L 23/16; H01L 29/0657; H01L 23/3675; H01L 25/0655; H01L 23/49822; H01L 23/3128; H01L 23/36; H01L 2924/15311; H01L 2924/3511; H01L 2224/0401; H01L 2924/1431; H01L 24/32;
(Continued)

(56) References Cited

U.S. PATENT DOCUMENTS 5,394,609 A 3/1995 Ferguson et al.
6,392,143 B1 5/2002 Koshio
(Continued)

FOREIGN PATENT DOCUMENTS

JP 2017-005175 A 5/2017

*Primary Examiner* — Ahmed N Sefer
(74) *Attorney, Agent, or Firm* — Muir Patent Law, PLLC

(57) ABSTRACT

A semiconductor package includes a first substrate having a first surface and a second surface opposite to the first surface, a first semiconductor chip on the first surface of the first substrate, a second semiconductor chip on the first surface of the first, a stiffener on the first semiconductor chip and the second semiconductor chip, and an encapsulant on the first surface of the first substrate. The first substrate includes a plurality of first pads on the first surface thereof and a plurality of second pads on the second surface thereof. The first semiconductor chip is connected to a first group of first pads of the plurality of first pads. The second semiconductor chip is connected to a second group of first pads of the plurality of first pads. The stiffener covers a space between the first semiconductor chip and the second semiconductor chip. The encapsulant covers at least a sidewall of each of the first and second semiconductor chips and the stiffener.

20 Claims, 13 Drawing Sheets

(51) Int. Cl.
*H01L 23/498* (2006.01)
*H01L 23/31* (2006.01)
*H01L 23/36* (2006.01)
*H01L 23/16* (2006.01)
*H01L 29/06* (2006.01)
*H01L 23/367* (2006.01)

(52) U.S. Cl.
CPC .......... *H01L 23/36* (2013.01); *H01L 23/3675* (2013.01); *H01L 23/49822* (2013.01); *H01L 25/0655* (2013.01); *H01L 29/0657* (2013.01); H01L 24/13 (2013.01); H01L 24/16 (2013.01); H01L 24/17 (2013.01); H01L 24/32 (2013.01); H01L 24/73 (2013.01); H01L 2224/0401 (2013.01); H01L 2224/131 (2013.01); H01L 2224/16227 (2013.01); H01L 2224/17181 (2013.01); H01L 2224/32225 (2013.01); H01L 2224/73253 (2013.01); H01L 2924/10158 (2013.01); H01L 2924/1431 (2013.01); H01L 2924/1434 (2013.01); H01L 2924/15311 (2013.01); H01L 2924/18161 (2013.01); H01L 2924/3511 (2013.01)

(58) Field of Classification Search
CPC ..... H01L 2224/131; H01L 2924/18161; H01L 24/13; H01L 24/73; H01L 2224/32225; H01L 2924/1434; H01L 2924/10158; H01L 2224/73253; H01L 2224/16227; H01L 24/16; H01L 2224/17181; H01L 24/17; H01L 23/4334; H01L 23/49816; H01L 23/5385; H01L 23/24; H01L 25/18
See application file for complete search history.

(56) References Cited

U.S. PATENT DOCUMENTS

| | | | |
|---|---|---|---|
| 6,429,530 B1 | 8/2002 | Chen | |
| 6,982,380 B2 | 1/2006 | Hoffmann et al. | |
| 7,135,353 B2 | 11/2006 | Kim et al. | |
| 7,202,556 B2 | 4/2007 | Khng et al. | |
| 7,208,828 B2 | 4/2007 | Cher 'Khng et al. | |
| 7,253,022 B2 | 8/2007 | Khng et al. | |
| 7,319,591 B2 | 1/2008 | Coffin et al. | |
| 7,327,032 B2 | 2/2008 | Yoon | |
| 7,368,809 B2 | 5/2008 | Huang et al. | |
| 7,489,512 B2 | 2/2009 | Coffin et al. | |
| 7,550,315 B2 | 6/2009 | Khng et al. | |
| 7,550,830 B2 | 6/2009 | Yoon | |
| 7,723,834 B2 | 5/2010 | Hwang | |
| 7,816,183 B2 | 10/2010 | Kawata | |
| 7,927,919 B1 | 4/2011 | Fan et al. | |
| 7,944,046 B2 | 5/2011 | Chao | |
| 8,037,594 B2 | 10/2011 | Coffin et al. | |
| 8,304,917 B2 | 11/2012 | Fan et al. | |
| 8,963,339 B2 | 2/2015 | He et al. | |
| 9,324,582 B2 | 4/2016 | Lin et al. | |
| 9,341,671 B2 | 5/2016 | Wang et al. | |
| 9,406,649 B2 | 8/2016 | He et al. | |
| 9,453,877 B2 | 9/2016 | Wang et al. | |
| 9,496,248 B2 | 11/2016 | Lee et al. | |
| 9,589,933 B2 | 3/2017 | Yu et al. | |
| 9,664,707 B2 | 5/2017 | Wang et al. | |
| 9,673,148 B2 | 6/2017 | Hu | |
| 9,691,696 B2 | 6/2017 | Shen et al. | |
| 2004/0124515 A1 | 7/2004 | Tao et al. | |
| 2010/0109169 A1 | 5/2010 | Kolan et al. | |
| 2010/0171206 A1* | 7/2010 | Chu | H01L 25/105 257/E23.169 |
| 2011/0227108 A1 | 9/2011 | Tetz et al. | |
| 2014/0217575 A1* | 8/2014 | Hung | H01L 23/373 257/713 |
| 2014/0252634 A1* | 9/2014 | Hung | H01L 23/3675 257/773 |
| 2015/0091167 A1 | 4/2015 | Geissler et al. | |
| 2015/0255426 A1 | 9/2015 | Son et al. | |
| 2015/0262928 A1 | 9/2015 | Shen et al. | |
| 2015/0262972 A1 | 9/2015 | Katkar et al. | |
| 2015/0287697 A1 | 10/2015 | Tsai et al. | |
| 2015/0333049 A1 | 11/2015 | Woychik et al. | |
| 2015/0357255 A1 | 12/2015 | Lin et al. | |
| 2016/0049361 A1 | 2/2016 | Wang et al. | |
| 2016/0133600 A1 | 5/2016 | Shen et al. | |
| 2016/0163650 A1* | 6/2016 | Gao | H01L 23/3128 438/126 |
| 2018/0138101 A1 | 5/2018 | Yu et al. | |
| 2018/0138116 A1 | 5/2018 | Lin et al. | |
| 2018/0138127 A1* | 5/2018 | Lee | H01L 23/562 |
| 2018/0211929 A1* | 7/2018 | Bae | H01L 24/17 |
| 2018/0261528 A1 | 9/2018 | Chen et al. | |
| 2018/0350708 A1* | 12/2018 | Chang Chien | H01L 23/48 |
| 2019/0006257 A1* | 1/2019 | Hsu | H01L 24/19 |
| 2019/0067157 A1* | 2/2019 | Lin | H01L 25/50 |
| 2019/0252340 A1* | 8/2019 | Pei | H01L 24/25 |
| 2020/0006309 A1* | 1/2020 | Chen | H01L 21/481 |
| 2020/0035606 A1* | 1/2020 | Bhagavat | H01L 23/562 |

\* cited by examiner

SEMICONDUCTOR PACKAGE

CROSS-REFERENCE TO RELATED APPLICATION

This application is a continuation of and claims priority to U.S. patent application Ser. No. 16/109,766 filed on Aug. 23, 2018, which claims priority under 35 U.S.C. § 119 to Korean Patent Application No. 10-2017-0182025, filed on Dec. 28, 2017 in the Korean Intellectual Property Office, the disclosure of each of which is hereby incorporated by reference in its entirety.

TECHNICAL FIELD

Example embodiments of the present disclosure relate to a semiconductor package including a plurality of semiconductor chips.

DISCUSSION OF RELATED ART

High performance, high speed, and small sizes of electric components have been increasingly demanded with continuing developments of the electronics industry. Responding to this trend, a semiconductor package has been manufactured in such a way that a plurality of semiconductor chips are mounted on a single interposer or package substrate. A warpage in a semiconductor package may be caused by a difference in coefficients of thermal expansion between elements constituting the semiconductor package. A magnitude of the warpage may be increased in a semiconductor package including a plurality of semiconductor chips.

SUMMARY

According to example embodiments of the inventive concepts, a semiconductor package may include a first substrate having a first surface and a second surface opposite to the first surface, the first substrate including a plurality of first pads on the first surface thereof and a plurality of second pads on the second surface thereof; a first semiconductor chip on the first surface of the first substrate, the first semiconductor chip connected to a first group of first pads of the plurality of first pads; a second semiconductor chip on the first surface of the first substrate, the second semiconductor chip connected to a second group of first pads of the plurality of first pads; a stiffener on the first semiconductor chip and the second semiconductor chip, the stiffener covering a space between the first semiconductor chip and the second semiconductor chip; and an encapsulant on the first surface of the first substrate, the encapsulant covering at least a sidewall of each of the first and second semiconductor chips and the stiffener.

According to example embodiments of the inventive concepts, a semiconductor package may include an first substrate having opposite first and second surfaces, wherein the first substrate includes a plurality of first pads on the first surface thereof and a plurality of second pads on the second surface thereof, a first semiconductor chip on the first surface of the first substrate, wherein the first semiconductor chip is connected to first portions of the plurality of first pads and includes a stepped portion that is lower than an upper surface thereof, a second semiconductor chip on the first surface of the first substrate, wherein the second semiconductor chip is connected to second portions of the plurality of first pads and has an upper surface that is substantially flush with a surface of the stepped portion of the first semiconductor chip, a stiffener on the stepped portion of the first semiconductor chip and the second semiconductor chip, wherein the stiffener covers a space between the first semiconductor chip and the second semiconductor chip and has a plate shape, and an encapsulant on the first surface of the first substrate, wherein the encapsulant covers a sidewall of the first semiconductor chip, a sidewall of the second semiconductor chip, and a sidewall of the stiffener.

According to example embodiments of the inventive concepts, a semiconductor package may include a package substrate, wherein the package substrate includes an insulating member having opposite first and second surfaces, a plurality of first pads on the first surface of the insulating member, a plurality of second pads on the second surface of the insulating member, and a redistribution layer in the insulating member and connected to the plurality of first pads and the plurality of second pads, a first semiconductor chip on the package substrate, wherein the first semiconductor chip is connected to the plurality of first pads, a second semiconductor chip on the package substrate, wherein the second semiconductor chip is connected to the plurality of second pads, a stiffener on the first semiconductor chip and the second semiconductor chip, wherein the stiffener covers a space between the first and second semiconductor chips, and an encapsulant on the package substrate, wherein the encapsulant covers at least a sidewall of the first semiconductor chip, at least a sidewall of the second semiconductor chip, and a sidewall of the stiffener.

DETAILED DESCRIPTION OF THE EMBODIMENTS

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
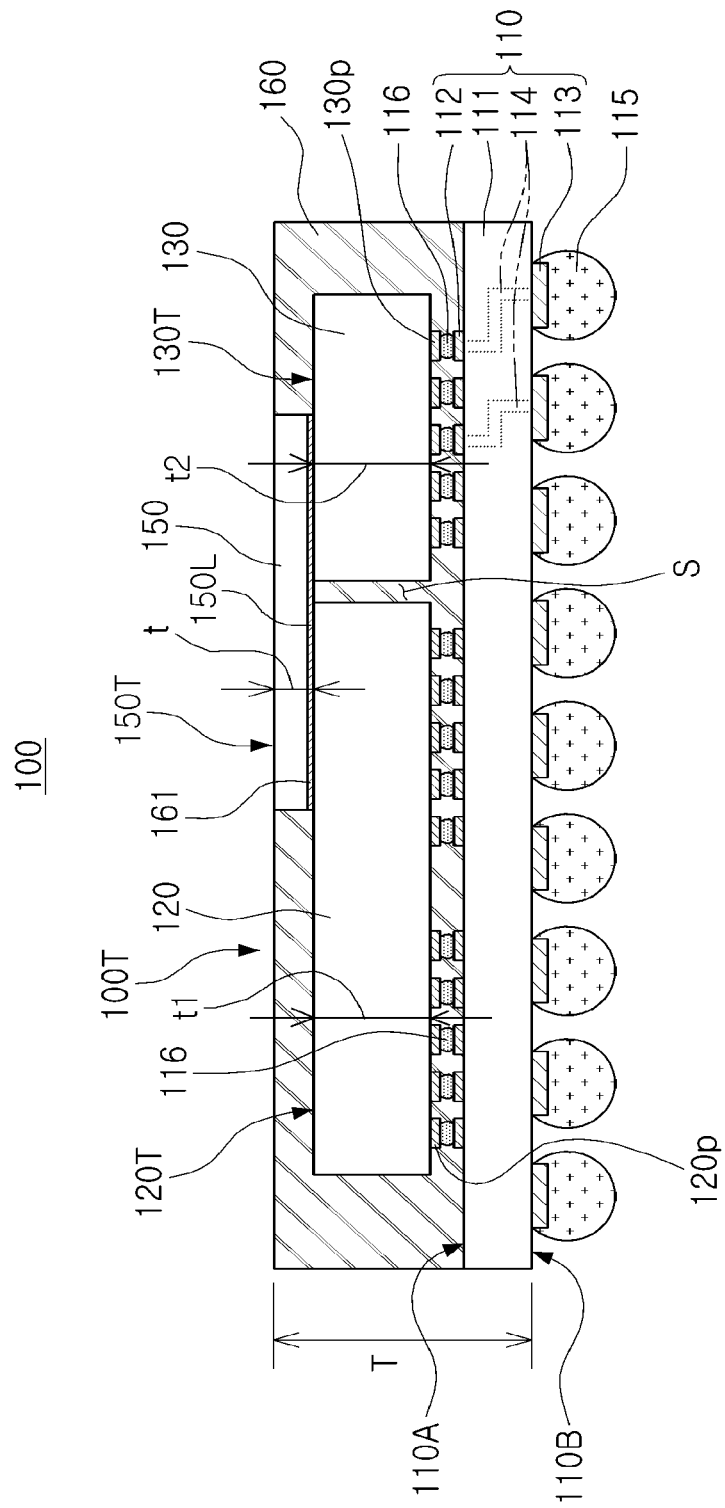
FIG. 1 is a cross-sectional view of a semiconductor package according to example embodiments.
Figure 2:
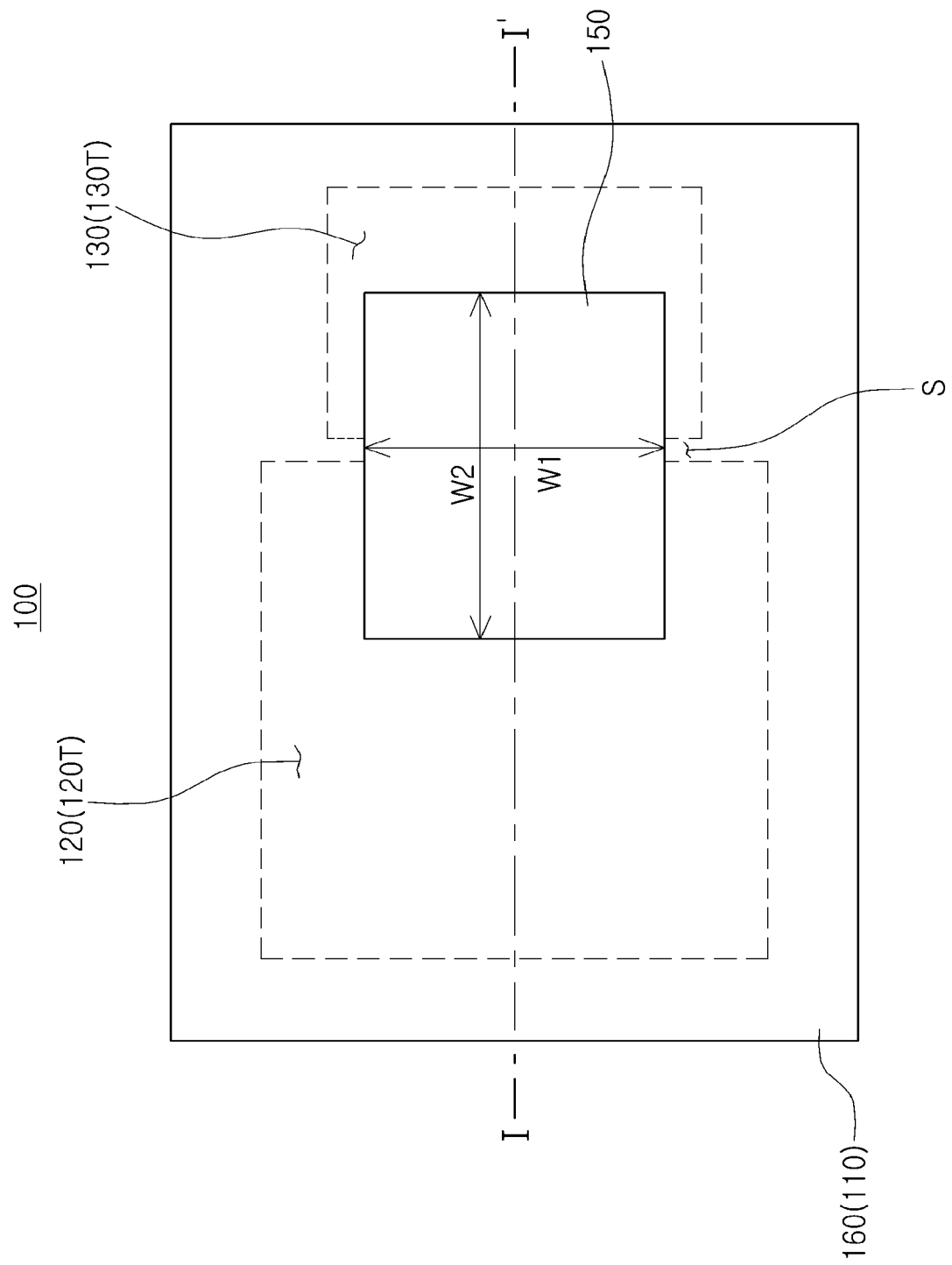
FIG. 2 is a plan view of the semiconductor package of FIG. 1.

FIG. 1 is a cross-sectional view of a semiconductor package according to example embodiments. FIG. 2 is a plan view of the semiconductor package of FIG. 1. FIG. 1 is a cross-sectional view taken along line I-I' of FIG. 2.

Referring to FIGS. 1 and 2, a semiconductor package 100 includes an interposer 110 having a first surface 110A and an opposing second surface 110B, first semiconductor chip 120 on the first surface 110A of the interposer 110 and second semiconductor chip 130 on the first surface 110A of the interposer 110, and an encapsulant 160 on the first surface 110A of the interposer 110. The semiconductor package 100 further includes a stiffener 150 on the first and second semiconductor chips 120 and 130.

The interposer 110 includes a substrate 111, a wiring circuit 114 in the substrate 111, a plurality of first pads 112 on the first surface 110A thereof, and a plurality of second pads 113 on the second surface 110B thereof. The plurality of first pads 112 and the plurality of second pads 113 may be connected to the wiring circuit 114. Even though, in FIG. 1, the wiring circuit 114 is shown in a dotted line in a portion of the substrate 111, the inventive concepts are not limited thereto. The wiring circuit 114 may be connected to respective ones of the plurality of first and second pads 112 and 113.

The substrate 111 may be a silicon substrate. In some embodiments, the substrate 111 may be a printed circuit board. For example, the substrate 111 may include a thermosetting resin, e.g., an epoxy resin, a thermoplastic resin, e.g., a polyimide, or a photosensitive insulating material.

In some embodiments, the substrate 111 may include a prepreg, an ajinomoto build-up film (ABF), FR-4, or a bismaleimide triazine (BT) resin.

Outer terminals 115 are disposed on the plurality of second pads 113 on the second surface 110B of the interposer 110. The outer terminals 115 may include tin (Sn), lead (Pb), nickel (Ni), gold (Au), silver (Ag), copper (Cu), bismuth (Bi), and/or an alloy thereof.

The first semiconductor chip 120 may have an active surface facing the first surface 110A of the interposer 110 and an inactive surface opposite to the active surface. The first semiconductor chip 120 includes first connection electrodes (or connection pads) 120P disposed on the active surface thereof. Connection terminals 116 respectively are disposed between the first connection electrodes 120P and the first pads 112 of the interposer 110. The first semiconductor chip 120 may be flip-chip bonded on the first surface 110A of the interposer 110 by the connection terminals 116. The first semiconductor chip 120 may include a logic chip, e.g., a controller or a microprocessor.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

Although the second semiconductor chip 130 is shown as a single chip in the drawings, the inventive concepts are not limited thereto. The second semiconductor chip 130 may include a plurality of semiconductor chips (refer to FIGS. 8 and 9). The second semiconductor chip 130 may include a memory chip, such as a high-band memory (HBM). In some embodiments, the second semiconductor chip 130 may include a DRAM, an SRAM, a flash memory, a PRAM, an ReRAM, a FeRAM, or an MRAM.

The second semiconductor chip 130 may have an active surface having the second connection electrodes 130P thereon, and an inactive surface opposite to the active surface. The second semiconductor chip 130 may be flip-chip bonded to the interposer 110 such that the second connection electrodes 130P are connected to the first pads 112 of the interposer 110 by the connection terminals 116. According to example embodiments, a first group of the first pads 112 among the plurality of first pads 112 are connected to chip pad of the first semiconductor chip 120 and second group of the first pads 112 among the plurality of first pads 112 are connected to chip pad of the second semiconductor chip 130. According to example embodiments, the first group of the first pads 112 among the plurality of first pads 112 are not connected to the chip pad of the second semiconductor chip 130 and the second group of the first pads 112 among the plurality of first pads 112 are not connected to the chip pad of the first semiconductor chip 120.

The second semiconductor chip 130 may be laterally spaced apart from the first semiconductor chip 120. According to this exemplary embodiment, an upper surface 120T of the first semiconductor chip 120 is positioned at the same level in a direction perpendicular to the first surface 110A of the interposer 110 as an upper surface 130T of the second semiconductor chip 130 and a lowermost surface of the first semiconductor chip 120 is positioned at the same level in a direction perpendicular to the first surface 110A of the interposer 110 as a lowermost surface of the second semiconductor chip 130. However, the disclosure is not limited thereto. For example, in alternative embodiments, an upper surface 120T of the first semiconductor chip 120 may be positioned at a level higher than a level of the upper surface 130T of the second semiconductor chip 130 in a direction perpendicular to the first surface 110A of the interposer 110 (see, e.g., FIG. 12). A space S between the first semiconductor chip 120 and the second semiconductor chip 130 may be a region in which a warpage of the semiconductor package 100 is generated due to a difference in coefficients of thermal expansion (CTEs) between other elements of the semiconductor package 100, e.g., the encapsulant 160 and the interposer 110. For example, when the encapsulant 160 includes an organic material having a relatively high CTE, such as an epoxy molding compound, and the substrate 111 of the interposer 110 includes silicon, the warpage may be increased by a difference in CTEs therebetween. According to example embodiments, the encapsulant 160 may be single layered and may comprise homogeneous molding compound.

The stiffener 150 is disposed on the first semiconductor chip 120 and the second semiconductor chip 130 and connects the first and second semiconductor chips 120 and 130. The stiffener 150 covers the space S between the first and second semiconductor chips 120 and 130 that may act as a bending region. The stiffener 150 may be attached to the upper surfaces 120T and 130T of the first semiconductor chip 120 and the second semiconductor chip 130 using the adhesive layer 161. The adhesive layer 161 may include a non-conductive film (NCF), an anisotropic conductive film (ACF), an ultraviolet (UV) sensitive film, an instant adhesive, a thermoset adhesive, a laser curable adhesive, an ultrasonic curable adhesive, and a non-conductive paste (NCP).

The encapsulant 160 may cover the first and second semiconductor chips 120 and 130, e.g., sidewalls and portions of upper surfaces of the first and second semiconductor chips 120 and 130. The encapsulant 160 may cover a sidewall of the stiffener 150. The encapsulant 160 may have a flat upper surface 100T that is substantially flush with an upper surface 150T of the stiffener 150. The flat upper surface 100T of the encapsulant 160 may be formed by polishing the encapsulant 160 to expose the stiffener 150.

The stiffener 150 may have a plate shape. The stiffener 150 may have a thickness t in a direction perpendicular to the first surface 110A of the interposer 110 sufficient enough to prevent or inhibit the warpage from occurring. However, a thickness T of the semiconductor package 100 in a direction perpendicular to the first surface 110A of the interposer 110 may be limited not to exceed a certain thickness. The thickness t of the stiffener 150 may be less than 20% of the thickness T of the semiconductor package 100. For example, the thickness t of the stiffener 150 may be less than 500 μm. According to example embodiments, a thickness t1 of the first semiconductor chip 120 may be the same as the thickness t2 of the second semiconductor chip 130 in a direction perpendicular to the first surface 110A of the interposer 110, but the disclosure is not limited thereto. In alternative embodiments, the first and second semiconductor devices 120 and 130 may have varying thickness in the direction perpendicular to the first surface 110A of the interposer 110. According to example embodiments, the thickness t of the stiffener 150 may be less than the thickness t1 of the first semiconductor chip 120 and the thickness t of the stiffener 150 may be less than the thickness t2 of the second semiconductor chip 130.

The stiffener 150 may include a material having a rigidity (e.g., Young's modulus) greater than the encapsulant 160.

According to example embodiments, the stiffener 150 may be rectangular-shaped and the side surfaces of the rectangular-shaped stiffener 150 parallel to the side surfaces of the semiconductor package 100 or the side surfaces of the first and second semiconductor chips 120 and 130 may have corresponding lengths smaller than the length of the upper surface 150T or the length of the lower surface 150L of the stiffener 150 in a direction parallel to the first surface 110A of the interposer 110. According to example embodiments, the upper surface 150T of the stiffener 150 may have the same length in a direction parallel to the first surface 110A of the interposer 110 as the lower surface 150L of the stiffener in the direction parallel to the first surface 110A of the interposer 110. According to example embodiments, the thickness t of the stiffener 150 may be smaller than a thickness of the adhesive layer 161 in the direction perpendicular to the first surface 110A of the interposer 110. According to example embodiments, the lower surface 150L of the stiffener 150 faces the inactive surfaces of the first and second semiconductor chips 120 and 130 (e.g., upper surfaces 120T and 130T of the first and second semiconductor chips 120 and 130, respectively) and the upper surface 150T of the stiffener 150 faces away from the inactive surfaces of the first and second semiconductor chips 120 and 130.

In some embodiments, the stiffener 150 may include the same material composition as the substrate 111 of the interposer 110. The material composition of the stiffener 150 allows sufficient control of the stresses caused by the CTE mismatches of the various materials in the semiconductor package 100; thereby, providing the semiconductor package 100 with less bowing and so improved co-planarity (in compliance with industry specifications) with the surface (e.g., PCB board) to which it is ultimately bound. Furthermore, the material composition of the stiffener 150 allows a lighter package to be realized, which is beneficial for applications where weight is a factor. In this exemplary embodiment, a mismatch of CTEs between an upper part and a lower part of the semiconductor package 100 may be prevented or minimized, thus reducing or preventing the warpage. According to example embodiments, the stiffener 150 may not include a logic circuit and/or may not include a transistor. The stiffener 150 and the substrate 111 of the interposer 110 may include, e.g., silicon. According to an exemplary embodiment, the stiffener may be formed entirely of crystalline semiconductor material, but the disclosure is not limited thereto. According to example embodiments, the stiffener 150 may extend from a portion of the upper surface 120T of the first semiconductor chip 120 onto an adjacent portion of the upper surface 130T of the second semiconductor chip 130 and may be provided at an edge region of the semiconductor package 100. Thus, warpage in the edge region of the semiconductor package 100 (e.g., edge region of the interposer 110) may be reduced. According to example embodiments, the stiffener 150 may include a redistribution line therein as a wiring structure to connect the first and second semiconductor chips 120 and 130.

Referring to FIG. 2, an area (or size) of the first semiconductor chip 120 may have larger than an area (or size) of the second semiconductor chip 130. The stiffener 150 has a first width W1 in a first direction (i.e., vertical direction) and a second width W2 in a second direction (i.e., horizontal direction) perpendicular to the first direction. The stiffener 150 may be disposed on the upper surfaces 120T and 130T of adjacent portions of the first and second semiconductor chips 120 and 130. According to example embodiments, less than 50% (e.g., in a range between 20%-40%) of the surface area of the upper surface 120T of the first semiconductor chip 120 may be covered by the stiffener 150 and more than 50% (e.g., in a range between 60%-100%) of the surface area of the upper surface 130T of the second semiconductor chip 130 may be covered by the stiffener 150. However, the disclosure is not limited thereto. For example, in alternative embodiments, the entire surface area of the upper surface 120T of the first semiconductor chip 120 and the entire surface area of the upper surface 130T of the second semiconductor chip 130 may be covered by the stiffener 150 (see, e.g., FIG. 12).

Figure 3A:
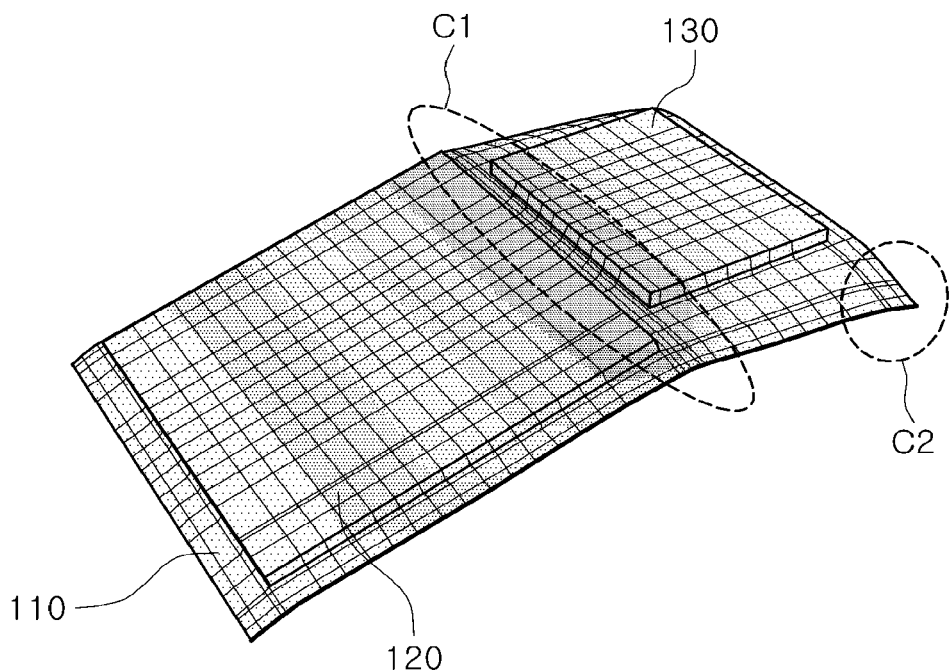
FIGS. 3A and 3B are schematic diagrams representing a warpage phenomenon before and after improvement, to illustrate an effect caused by a stiffener according to example embodiments.
Figure 3B:
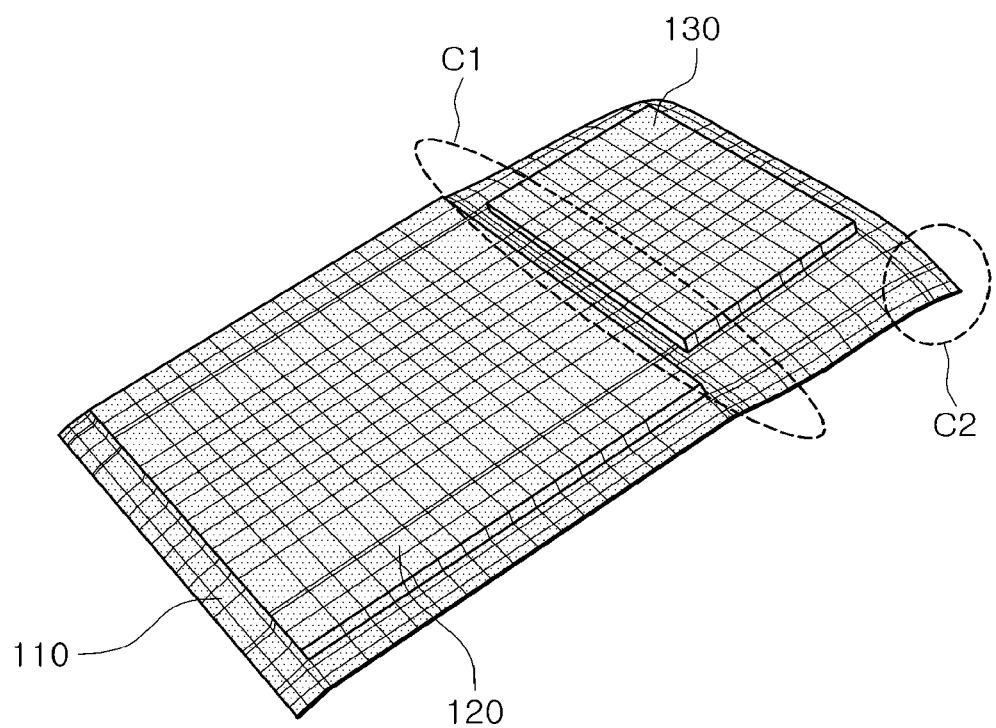

FIGS. 3A and 3B are schematic diagrams representing a warpage phenomenon before and after improvement, to illustrate an effect caused by a stiffener according to example embodiments.

Referring to 3A, when stiffener is not disposed on the upper surfaces 120T and 130T of adjacent portions of the first and second semiconductor chips 120 and 130, it is shown that a space C1 between the first and second semiconductor chips 120 and 130 is highly wrapped. However, when the stiffener is provided to cover a considerable portion (e.g., more than 75%) of the space C1, the warpage may be highly reduced in the same space C1.

Meanwhile, since the area (or size) of the second semiconductor chip 130 is less than the area (or size) of the first semiconductor chip 120, a contact area between the interposer 110 and the encapsulant 160 may be greater around the second semiconductor chip 130 than around the first semiconductor chip 120. Thus, a considerable amount of warpage may be caused in an edge region C2 of the interposer 110 around the second semiconductor chip 130 as well as in the space C1 between the first and second semiconductor chips 120 and 130

The warpage in the edge region C2 of the interposer 110 may be controlled by an occupying area of the stiffener 150.

Figure 4:
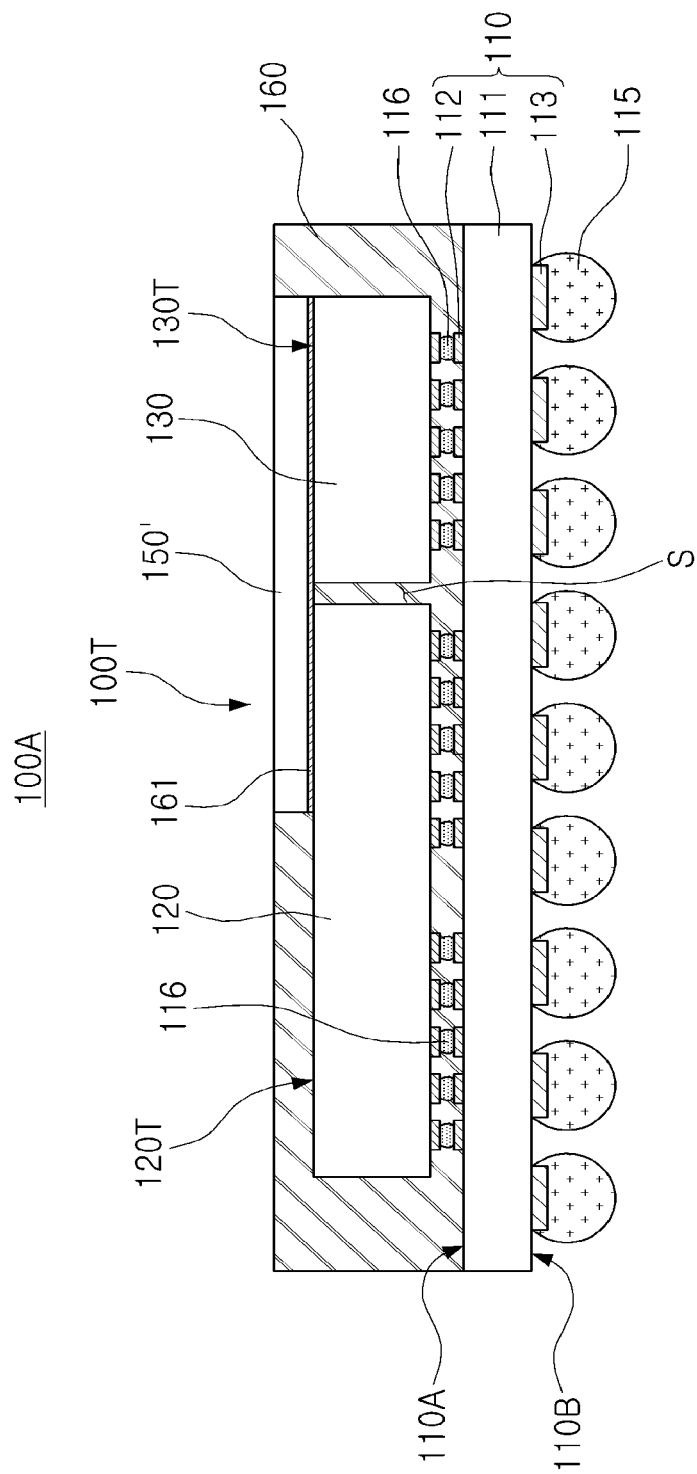
FIG. 4 is a cross-sectional view of a semiconductor package according to example embodiments.
Figure 5:
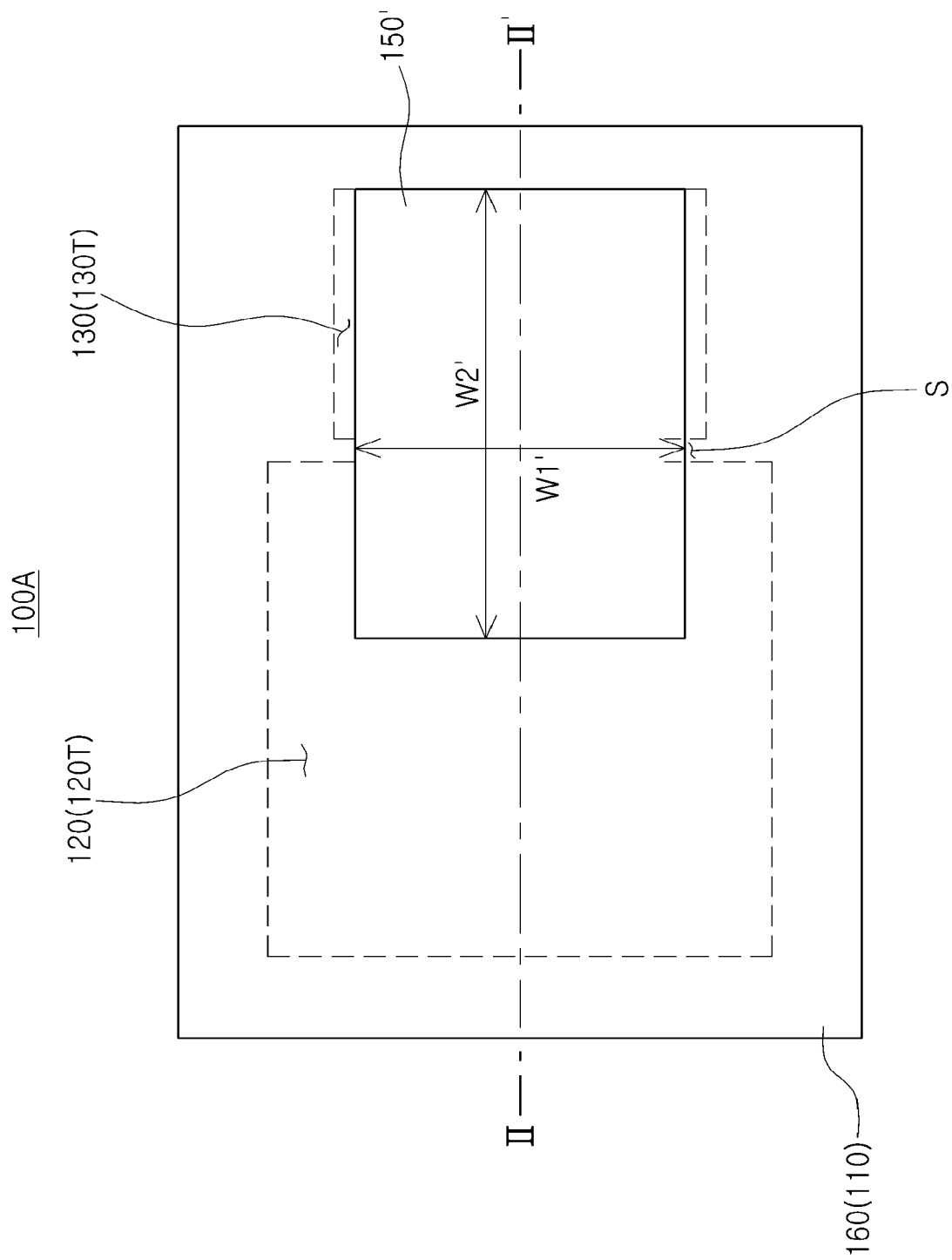
FIG. 5 is a plan view of the semiconductor package of FIG. 4.
Figure 6:
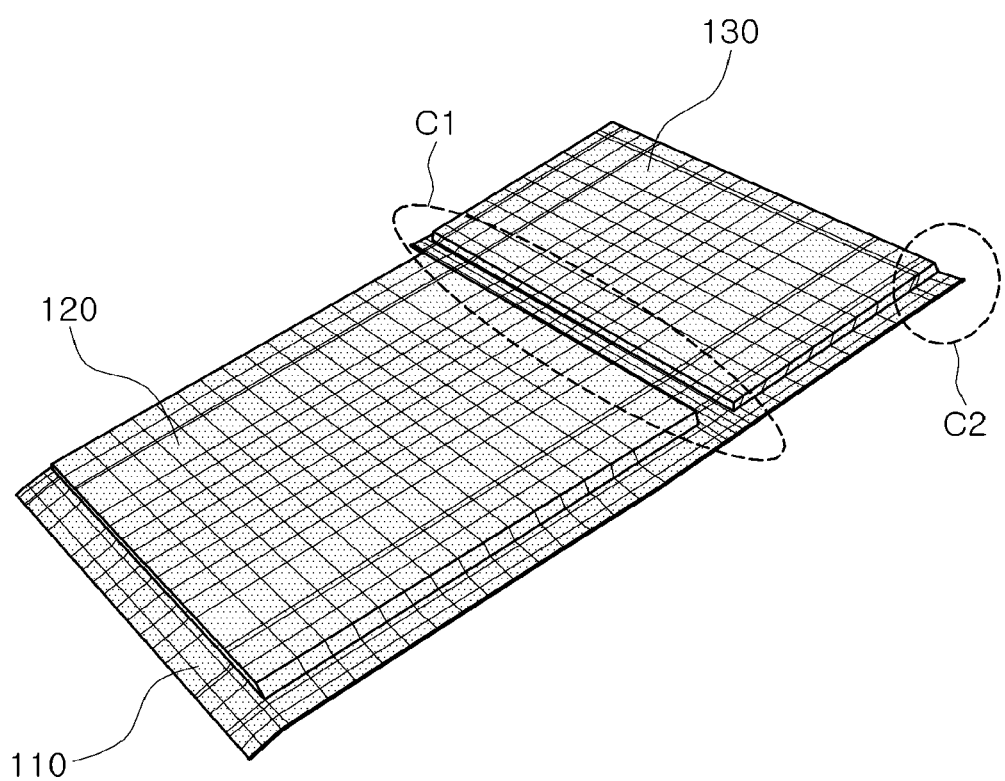
FIG. 6 is a schematic diagram representing a warpage phenomenon to illustrate an effect caused by a stiffener according to example embodiments.

FIG. 4 is a cross-sectional view of a semiconductor package according to example embodiments. FIG. 5 is a plan view of the semiconductor package of FIG. 4. FIG. 4 illustrates a cross-sectional view taken along line II-II' of FIG. 5. FIG. 6 is a schematic diagram representing a warpage phenomenon to illustrate an effect caused by a stiffener according to example embodiments.

Referring to FIGS. 4 and 5, a semiconductor package 100A is similar to or the same as the semiconductor package 100 described with reference to FIGS. 1 and 2, except for a structure of the stiffener 150'.

Referring to FIG. 5, since an area (or size) of the second semiconductor chip 130 may be less than an area (or size) of the first semiconductor chip 120, a contact area of the interposer 110 and the encapsulant 160 is larger around the second semiconductor chip 130 than around the first semiconductor chip 120. Thus, an edge region (refer to, e.g., C2 of FIG. 6) of the interposer 110 around the second semiconductor chip 130 may be warped.

According to one exemplary embodiment, the stiffener 150' may extend onto an upper surface of a peripheral portion of the second semiconductor chip 130 adjacent to the edge region of the interposer 110. For example, a first width W1' in a first direction (i.e., vertical direction) and a second width W2' of the stiffener 150' in a second direction (i.e., horizontal direction) perpendicular to the first direction may be increased greater than the first width W1 and the second width W2 of the stiffener 150 of the above example embodiment shown in FIGS. 1 and 2 to further cover the peripheral portion of the second semiconductor chip 130 adjacent to the edge region of the interposer 110.

As a result, as shown in FIG. 6, the warpage may be relieved in the edge region C2 of the interposer 110. In some embodiments, to improve the warpage in the edge C2 of the interposer 110, the stiffener 150' may cover almost the entire upper surface 130T of the second semiconductor chip 130. In other embodiments, a stiffener 150 (see FIG. 12) may extend onto the upper surface 120T of a peripheral portion of the first semiconductor chip 120 that is further away from the second semiconductor chip 130.

Figure 7:
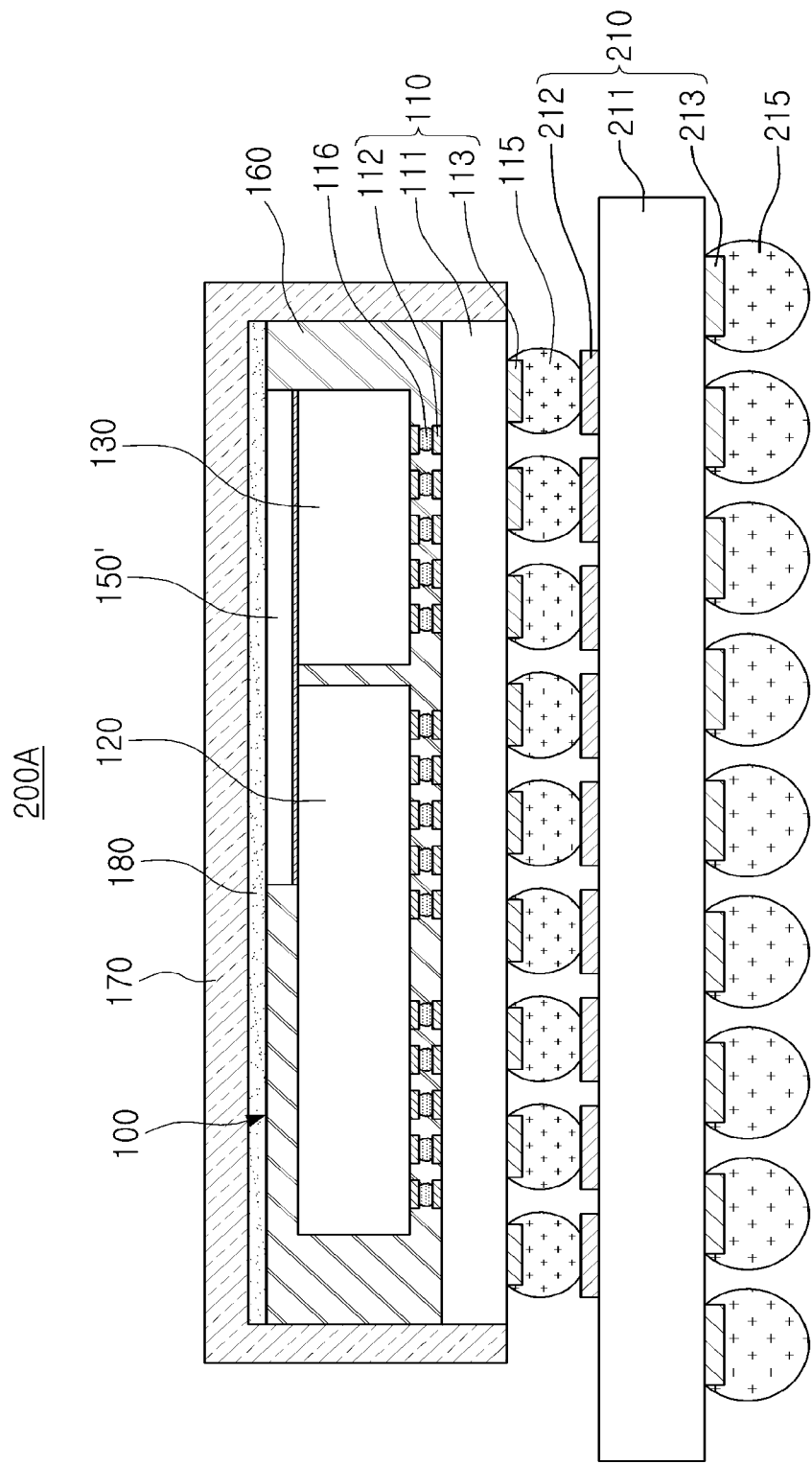
FIG. 7 is a cross-sectional view of a module including the semiconductor package of FIG. 4

FIG. 7 is a cross-sectional view of a module including the semiconductor package of FIG. 4

Referring to FIG. 7, a semiconductor package module 200A includes the semiconductor package 100A shown in FIG. 4 and a package substrate 210 which the semiconductor package 100A is mounted. The semiconductor package module 200A may be a complete semiconductor package (i.e., a semiconductor package in its final form after completing manufacturing processes of the semiconductor package). The semiconductor package 100A may be a component of the semiconductor package module 200A.

The package substrate 210 includes upper pads 212, lower pads 213, and a redistribution layer connecting the upper pads 212 and the lower pads 213. The upper pads 212 may be connected to the second pads 113 of the interposer 110 by the outer terminals 115. The redistribution layer includes at least one wiring circuit formed of a via and a conductive pattern, like a redistribution layer 314 of a package substrate 310 (see FIG. 13).

The upper pads 212 may be formed corresponding to the sizes and the arrangements of the second pads 113 of the interposer 110. The lower pads 213 may be formed to enlarge sizes and spaces of the lower pads 213, based on input/output (I/O) terminals of a circuit, such as a circuit of a motherboard. Such a circuit may be embodied by the redistribution layer of the package substrate 210. Outer connection terminals 215, e.g., solder bumps, to be connected to an outer circuit are disposed on the lower pads 213, respectively. The outer connection terminals 215 may include may include tin (Sn), lead (Pb), nickel (Ni), gold (Au), silver (Ag), copper (Cu), bismuth (Bi), and/or an alloy thereof.

The semiconductor package module 200A includes a heat spreader 170 on an upper surface of the semiconductor package 100A, e.g., an upper surface of the stiffener 150'. The heat spreader 170 may have a cap structure and extend onto a sidewall of the semiconductor package 100. The heat spreader 170 may be attached to the semiconductor package 100 using an adhesive member 180. The heat may be transmitted from the first and second semiconductor chips 120 and 130 to the heat spreader 170 through the stiffener 150'.

The heat spreader 170 may include a highly thermally conductive material, e.g., metal or ceramic. In some embodiments, the heat spreader 170 may include a thermal interface material (TIM). The adhesive member 180 may include an NCF, an ACF, a UV sensitive film, an instant adhesive, a thermoset adhesive, a laser curable adhesive, an ultrasonic curable adhesive, and an NCP.

Figure 8:
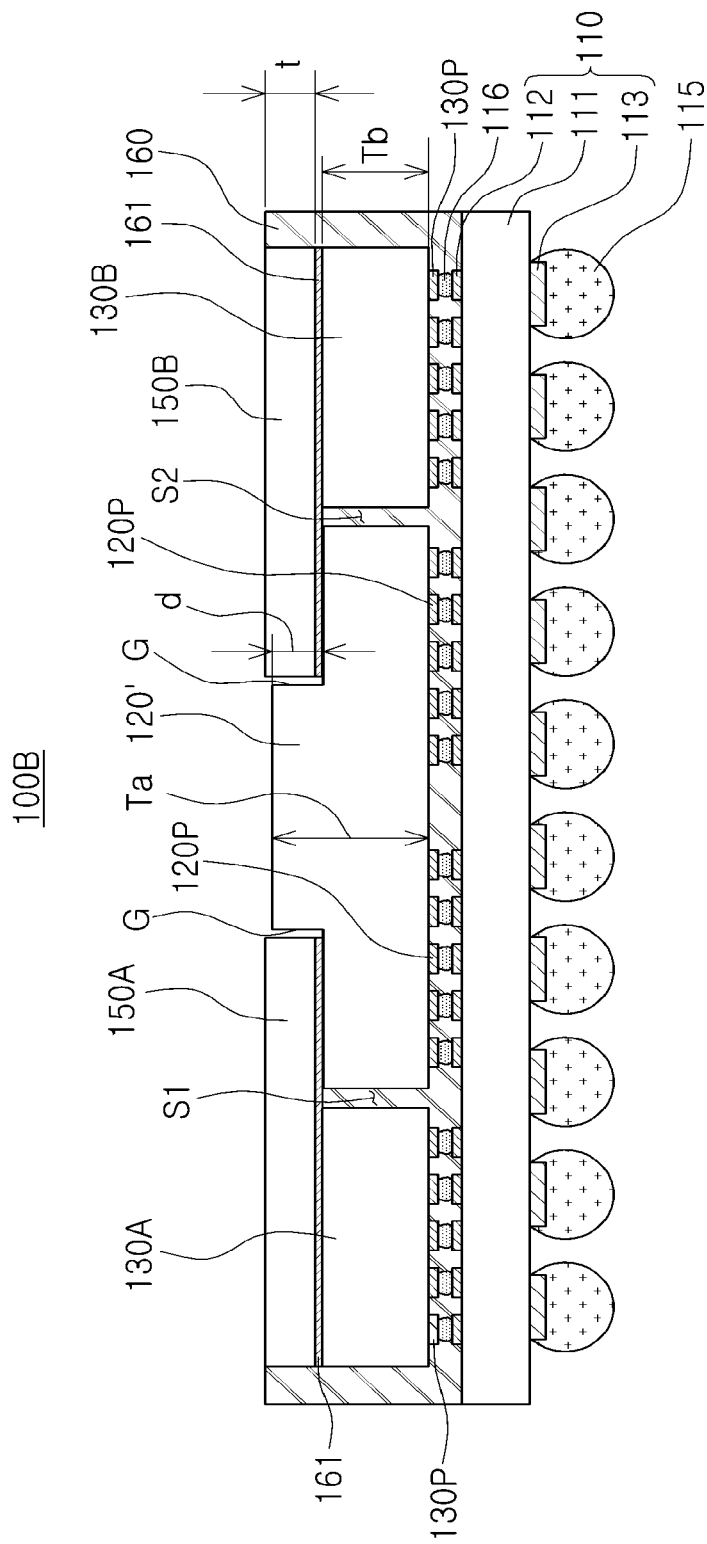
FIG. 8 is a cross-sectional view of a semiconductor package according to example embodiments.
Figure 9:
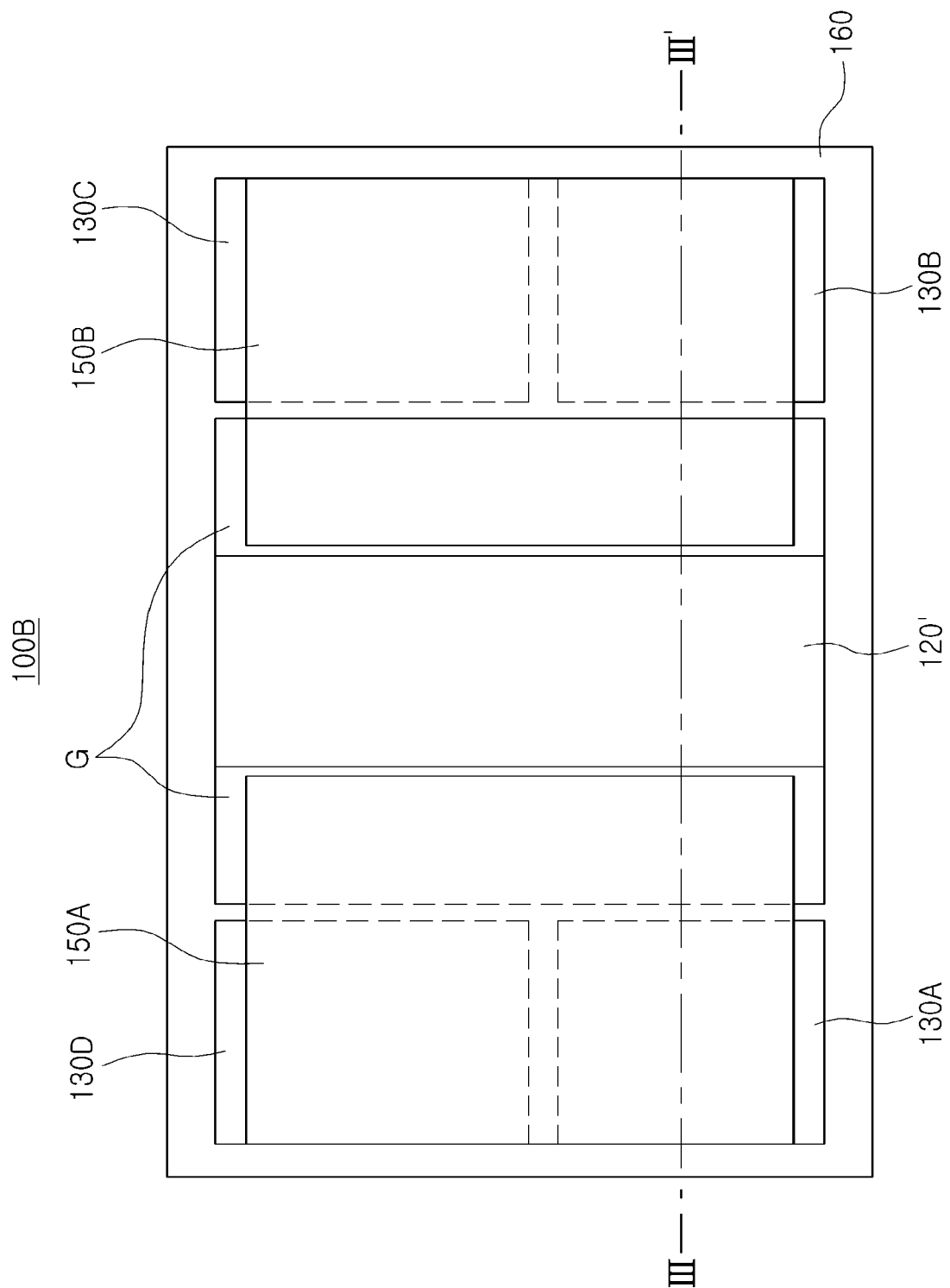
FIG. 9 is a plan view of the semiconductor package of FIG. 8.

FIG. 8 is a cross-sectional view of a semiconductor package according to example embodiments. FIG. 9 is a plan view of the semiconductor package of FIG. 8. FIG. 8 illustrates a cross-sectional view taken along line of FIG. 9.

Referring to FIGS. 8 and 9, a semiconductor package 100B is similar to or the same as the semiconductor package 100 described with reference to FIGS. 1 and 2, except that step portions G are formed in the first semiconductor chip 120', a plurality of the second semiconductor chips 130A, 130B, 130C, and 130D are provided, two stiffeners 150A and 150B are provided, a thickness Ta of the first semiconductor chip 120' and a thickness Tb of the second semiconductor chips 130A, 130B, 130C, and 130D are different from each other (Ta≠Tb).

The semiconductor package 100B includes the first semiconductor chip 120', such as an application specific integrated circuit (ASIC) and the four second semiconductor chips 130A to 130D, such HBMs, around the first semiconductor chip 120'. Referring to FIG. 9, each two of the four second semiconductor chips 130A to 130D are arranged at each of two opposite sides of the first semiconductor chip 120'.

The thickness Ta of the first semiconductor chip 120' may be different from the thickness Tb of the second semiconductor chips 130A to 130D. Referring to FIG. 8, the thickness Ta of the first semiconductor chip 120' may be greater than the thickness Tb of the second semiconductor chips 130A to 130D. The first semiconductor chip 120' include stepped portions G, which are lower than an upper surface thereof, in a region adjacent to the second semiconductor chips 130A to 130D, such that upper surfaces of the stiffeners 150A and 150B on the step portions G may be flush with an upper surface of the first semiconductor chip 120'. A surface (e.g., a recessed surface) of the first semiconductor chip 120' provided by the step portions G thereof may be substantially flush with upper surfaces of the second semiconductor chips 130A to 130D.

Referring to FIG. 9, the stepped portions G of the first semiconductor chip 120' are formed in opposite peripheral portions thereof, respectively. Each of the stepped portions G may correspond to each two of the second semiconductor chips 130A to 130D.

The stiffeners 150A and 150B may include a first stiffener 150A and a second stiffener 150B. The first and second stiffeners 150A and 150B may be disposed on the stepped portions G and on the upper surfaces of the second semiconductor chips 130A to 130D and cover spaces S1 and S2 between the first semiconductor chip 120' and the second semiconductor chips 130A to 130D. According to exemplary embodiments, a length of the first stiffener 150A in a direction parallel to an upper surface of the interposer 110 covering the stepped portion G of the first semiconductor chip 120' adjacent to the second semiconductor chips 130A and 130D may be smaller than a length of the first stiffener 150A in a direction parallel to an upper surface of the interposer 110 covering the upper surfaces of the second semiconductor chips 130A and 130D. According to exemplary embodiments, a length of the second stiffener 150B in a direction parallel to an upper surface of the interposer 110 covering the stepped portion G of the first semiconductor chip 120' adjacent to the second semiconductor chips 130B and 130C may be smaller than a length of the first stiffener 150A in a direction parallel to an upper surface of the interposer 110 covering the upper surfaces of the second semiconductor chips 130B and 130C.

The stepped portions G in the first semiconductor chip 120' may prevent a thickness of the semiconductor package 100B from increasing by a thickness t of the first and second stiffeners 150A and 150B. In some embodiments, the stepper portions G may be formed to have a depth d in a direction perpendicular to an upper surface of the interposer 110 greater than the thickness t of the first and second stiffeners 150A and 150B in the direction perpendicular to an upper surface of the interposer 110, thus providing the first and second stiffeners 150A and 150B in the semiconductor package 100B without an increase of the thickness of the semiconductor package 100B.

Figure 10:
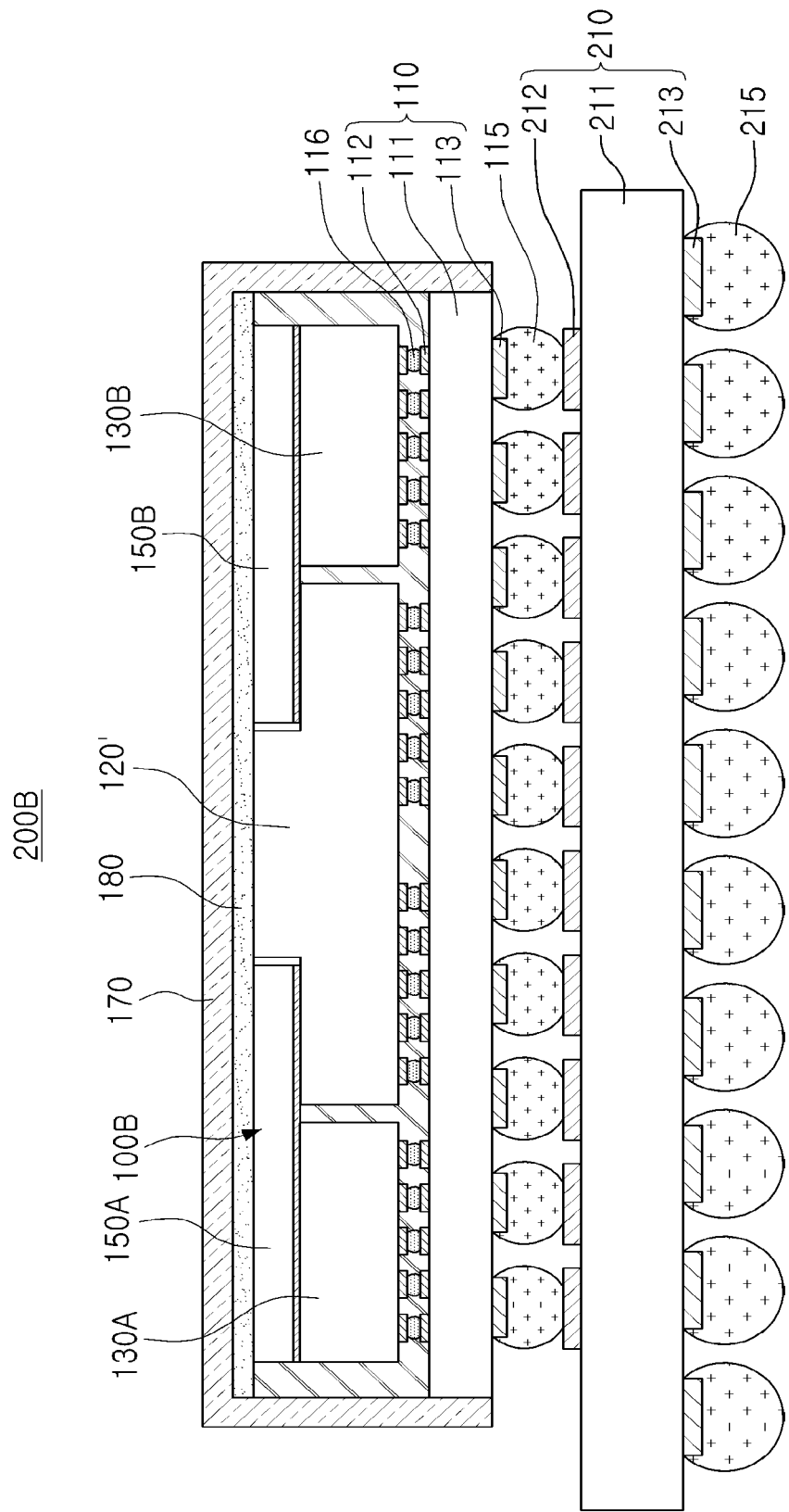
FIG. 10 is a cross-sectional view of a module including the semiconductor package of FIG. 8.

FIG. 10 is a cross-sectional view of a module including the semiconductor package of FIG. 8.

Referring to FIG. 10, a semiconductor package module 200B is similar to or the same as the semiconductor package module 200A described with reference to FIG. 7 except that the semiconductor package 100B shown in FIG. 8 is provided therein.

The semiconductor package module 200B includes the package substrate 210 and the semiconductor package 100B shown in FIG. 8. The package substrate 210 includes the upper pads 212, the lower pads 213, and the redistribution layer connecting the upper pads 212 and the lower pads 213. The upper pads 212 may be connected to the second pads 113 of the interposer 110 by the outer terminals 115.

The semiconductor package module 200B includes the heat spreader 170 on an upper surface and a sidewall of the semiconductor package 100B. Since upper surfaces of the first and second stiffeners 150A and 150B and an upper surface of the first semiconductor chip 120' are substantially flush with one another, the heat generated from the first semiconductor chip 120' and the second semiconductor chips 130A to 130D may be transmitted to the heat spreader 170 adjacent thereto through the upper surface of the first semiconductor chip 120' and the first and second stiffeners 150A and 150B.

Figure 11:
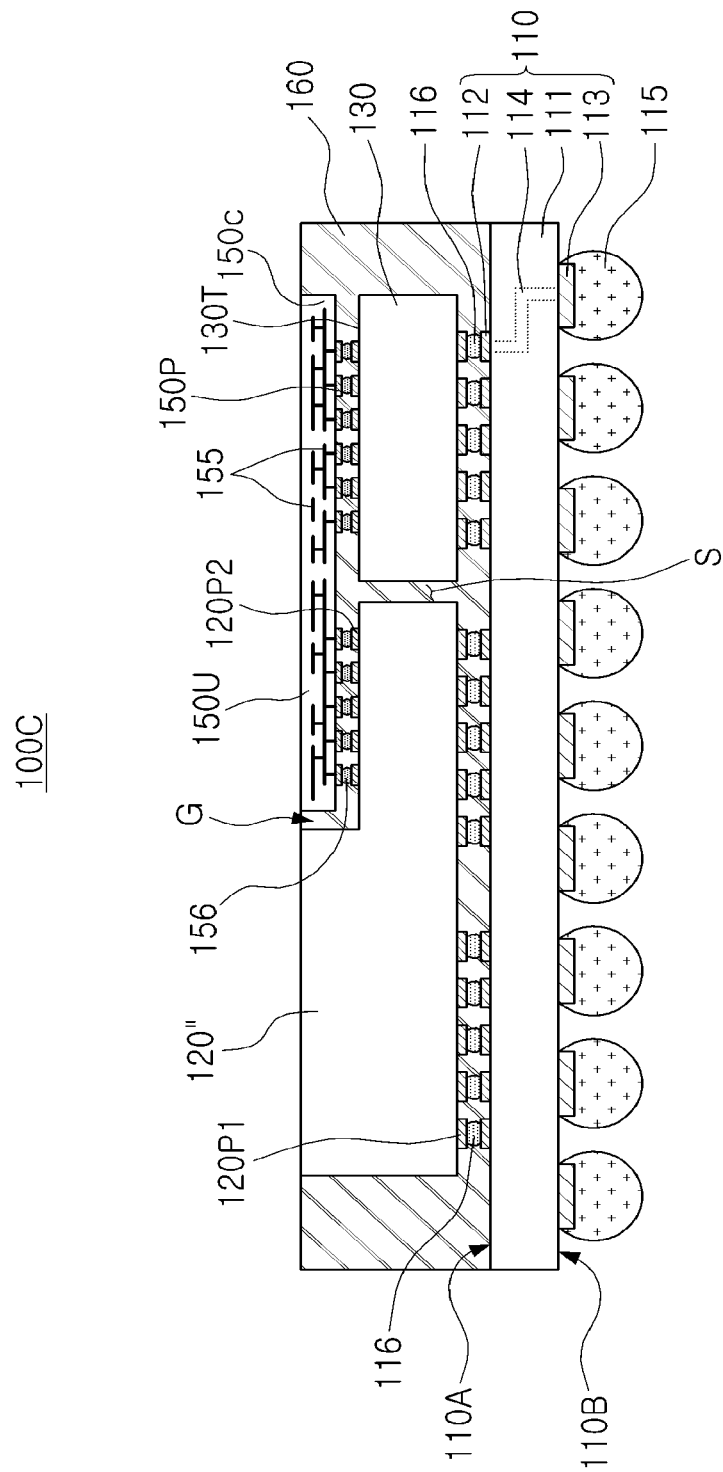
FIGS. 11, 12, and 13 are cross-sectional views of a semiconductor package according to example embodiments.

FIG. 11 is a cross-sectional view of a semiconductor package according to example embodiments.

Referring to FIG. 11, a semiconductor package 100C is similar to or the same as the semiconductor package 100 described with reference to FIGS. 1 and 2, except that a first semiconductor chip 120" and the second semiconductor chip 130 have different thickness, the first semiconductor chip 120" includes the stepped portion G therein, and a stiffener 150C includes a redistribution layer 155.

The thickness of the first semiconductor chip 120" in a direction perpendicular to an upper surface of the interposer 110 may be greater than the thickness of the second semiconductor chip 130 in the direction perpendicular to the upper surface of the interposer 110. The stepped portion G, which is lower than an upper surface of the first semiconductor chip 120", may be formed in a portion of the first semiconductor chip 120" contiguous to the second semiconductor chip 130. A surface provided by the stepped portion G (e.g., a recessed surface) of the first semiconductor chip 120", may be substantially flush with the upper surface 130T of the second semiconductor chip 130. Thus, the stiffener 150C on the step portion G of the first semiconductor chip 120" and on the second semiconductor chip 130 may be positioned at a flat level.

The stiffener 150C may be a redistribution structure including the redistribution layer (RDL) 155, but not be a dummy chip. The stiffener 150C may have a plurality of connection pads 150P on a lower surface (or a mounting surface) thereof that are connected to the redistribution layer 155. The redistribution layer 155 may be formed of vias and conductive patterns. The redistribution layer 155 may be formed of one or more layers.

The first semiconductor chip 120" includes first lower electrodes 120P1 on a lower surface thereof and first upper electrodes 120P2 on a portion of the upper surface (e.g., the recessed surface) thereof. The first lower electrodes 120P1 may be connected to the first pads 112 of the interposer 110 by first connection terminals 116. The first upper electrodes 120P2 may be provided on the stepped portion G to be connected to the connection pads 150P of the stiffener 150C by second connection terminals 156. The first upper electrodes 120P2 may be below the stiffener 150C.

The stiffener 150C may be fixed to the first and second semiconductor chips 120" and 130 with the second connection terminals 156 without using an adhesive. According to example embodiments, an underfill resin may be provided between the stiffener 150C and the first and second semiconductor chips 120" and 130. In some embodiments, the encapsulant 160 may cover sidewalls and at least a portion of a lower surface of the first semiconductor chip 120", sidewalls and at least a portion of a lower surface and at least a portion of an upper surface of the second semiconductor chip 130, and sidewalls and at least a portion of a lower surface of the stiffener 150C.

The second semiconductor chip 130 includes second lower electrodes 130P1 on a lower surface thereof and second upper electrodes 130P2 on an upper surface thereof. The second lower electrodes 130P1 may be connected to the first pads 112 of the interposer 110 by the first connection terminals 116. The second upper electrodes 130P2 may be connected to the connection pads 150P of the stiffener 150C by the second connection terminals 156.

Since the redistribution layer 155 of the stiffener 150C acts to connect at least some electrodes of the first and second semiconductor chips 120" and 130, the wiring circuit 114 of the interposer 110 may be simplified. In some embodiments, the wiring circuit 114 of the interposer 110 may be simplified, thus reducing the number of layers of the wiring circuit 114. Thus, a thickness of the semiconductor package 100C may be reduced.

Figure 12:
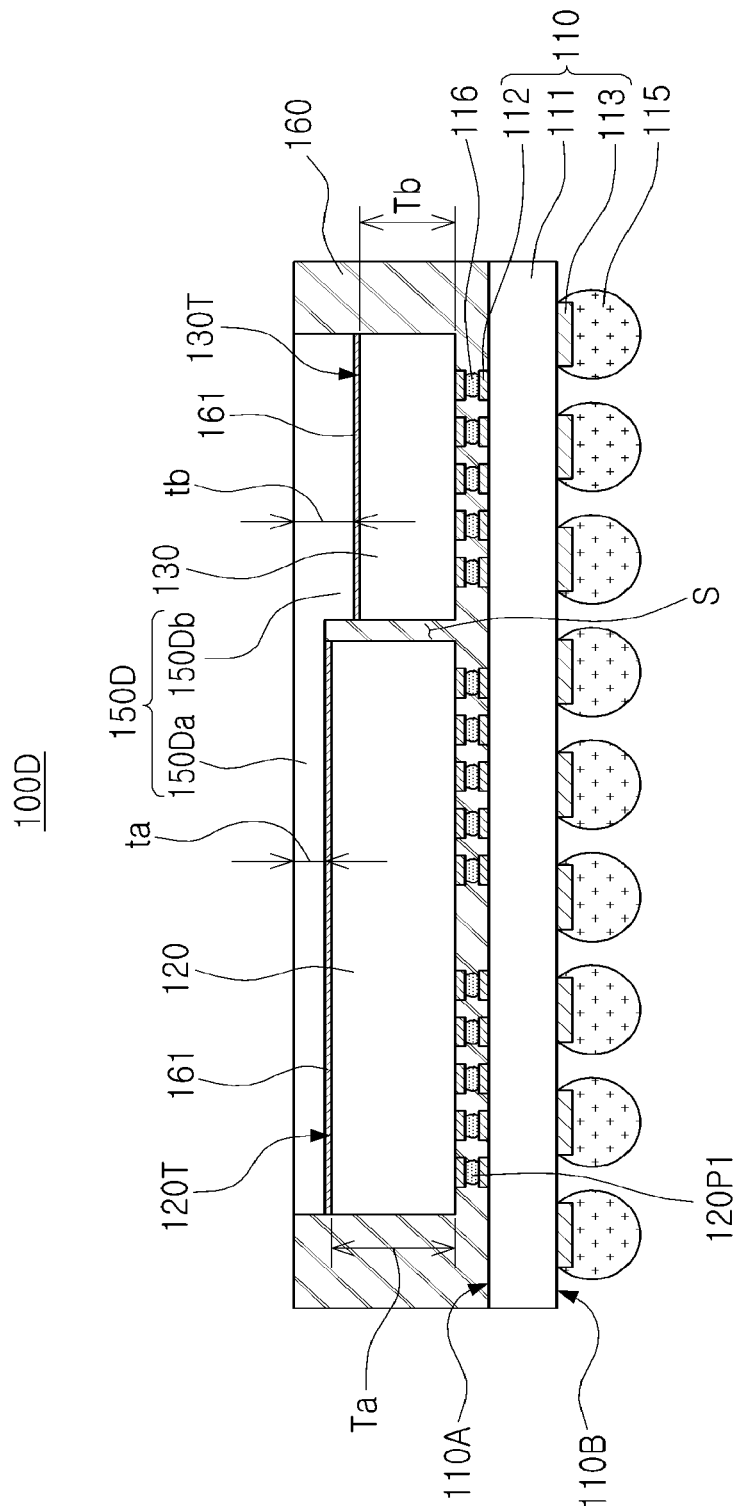

FIG. 12 is a cross-sectional view of a semiconductor package according to example embodiments.

Referring to FIG. 12, a semiconductor package 100D is similar to or the same as the semiconductor package 100 described with reference to FIGS. 1 and 2, except that thicknesses Ta and Tb of the first and second semiconductor chips 120 and 130 are different (Ta Tb), and a thickness of a stiffener 150D is different depending on portions thereof.

The thickness Ta of the first semiconductor chip 120 in a direction perpendicular to an upper surface of the interposer 110 may be greater than the thickness Tb of the second semiconductor chip 130 in the direction perpendicular to the upper surface of the interposer 110. In this exemplary embodiment, a structure of the stiffener 150D may be modified without forming a stepped portion in the first semiconductor chip 120, unlike the aforementioned example embodiments of FIGS. 8 and 11.

The stiffener 150D has a flat upper surface and includes a first portion 150Da having a first thickness ta in a direction perpendicular to an upper surface of the interposer 110 and a second portion 150Db having a second thickness tb in the direction perpendicular to the upper surface of the interposer 110 greater than the first thickness ta. The thinner first portion 150Da of the stiffener 150 may be disposed on the upper surface 120T of the first semiconductor chip 120. The thicker second portion 150Db of the stiffener 150 may be disposed on the upper surface 130T of the second semiconductor chip 130. A difference (tb−ta) between the thicknesses ta and tb of the stiffener 150 may be set to correspond to (e.g., to be substantially equal to or less than) a difference (Ta−Tb) between the thicknesses Ta and Tb of the first and second semiconductor chips 120 and 130.

The stiffener 150D may have a substantially flat upper surface flush with an upper surface of the encapsulant 160. The stiffener 150D may cover substantially the entire upper surface 120T of the first semiconductor chip 120 and the entire upper surface 130T of the second semiconductor chip 130, in cross-sectional view. The stiffener 150D may cover the space between the first and second semiconductor chips 120 and 130 and extend onto the upper surfaces 120T and 130T of the peripheral portions of the first and second semiconductor chips 120 and 130, adjacent to the edge region of the interposer 110.

Figure 13:
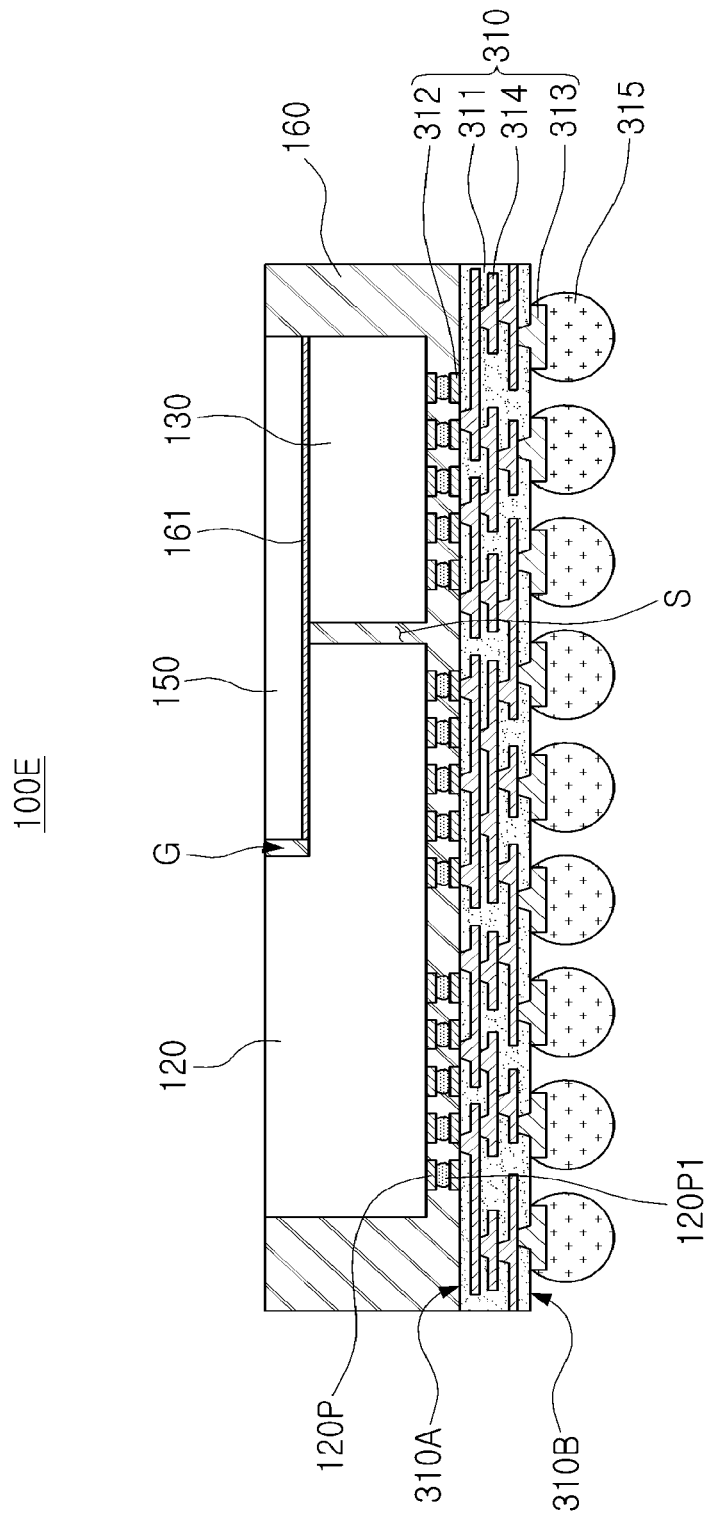

FIG. 13 is a cross-sectional view of a semiconductor package according to example embodiments.

Referring to FIG. 13, a semiconductor package 100E is similar to or the same as the semiconductor package 100 described with reference to FIGS. 1 and 2, except that the thicknesses of the first and second semiconductor chips 120 and 130 are different, a stepped portion G is formed in the first semiconductor chip 120, and a package substrate 310 is provided instead of the interposer.

In the case in which the thicknesses of the first and second semiconductor chips 120 and 130 are different, the stepped portion G is formed in the first semiconductor chip 120 so that the stiffener 150 is disposed thereon, similar to the stiffener 150 shown in FIG. 8.

According to example embodiments, the first and second semiconductor chips 120 and 130 are connected to the package substrate 310 without the interposer. The first and second semiconductor chips 120 and 130 are mounted on the package substrate 310.

The package substrate 310 includes an insulating member 311 having opposite first and second surfaces 310A and 310B, a plurality of first pads 312 and a plurality of second pads 313 that are on the first surface 310A and the second surface 310B, respectively, of the insulating member 311, a redistribution layer 314 in the insulating member 311 to connect the first and second pads 312 and 313. The insulating member 311 may be a printed circuit board (PCB). For example, the insulating member 311 may include a thermosetting resin, e.g., an epoxy resin, a thermoplastic resin, e.g., a polyimide, or a photosensitive insulating material.

In some embodiments, the insulating member 311 may include a prepreg, an ajinomoto build-up film (ABF), FR-4, or a bismaleimide triazine (BT) resin. The redistribution layer 314 and the first and second pads 312 and 313 may include copper (Cu), aluminum (Al), silver (Ag), tin (Sn), gold (Au), nickel (Ni), and/or an alloy thereof, but are not limited thereto. Outer terminals 315 may be disposed on the second pads 313, respectively. The outer terminals 315 may include tin (Sn), lead (Pb), nickel (Ni), gold (Au), silver (Ag), copper (Cu), bismuth (Bi), and/or an alloy thereof.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor package comprising:
    a substrate having a first surface and a second surface, opposite to the first surface, and including a plurality of pads on the first surface thereof;
    a first semiconductor chip disposed on the first surface of the substrate and electrically connected to a first group of pads among the plurality of pads;
    a second semiconductor chip disposed on the first surface of the substrate, electrically connected to a second group of pads among the plurality of pads, and spaced apart from the first semiconductor chip in a first direction;
    a stiffener disposed on the first semiconductor chip and the second semiconductor chip and covering a space between the first semiconductor chip and the second semiconductor chip; and
    an encapsulant disposed on the first surface of the substrate and covering at least portions of each of the first semiconductor chip, the second semiconductor chip, and the stiffener,
    wherein the first semiconductor chip has a first width in the first direction, the second semiconductor chip has a second width, narrower than the first width in the first direction, and the stiffener has a third width equal to or less than a sum of the first width, the second width and a width of the space in the first direction, and
    wherein the stiffener has greater rigidity than the encapsulant.

2. The semiconductor package of claim 1,
    wherein an area of an upper surface of the second semiconductor chip is less than an area of an upper surface of the first semiconductor chip, and
    wherein the stiffener covers portions of upper surfaces of each of the first and second semiconductor chips adjacent to each other.

3. The semiconductor package of claim 2,
    wherein the stiffener covers less than 50% of the area of the upper surface of the first semiconductor chip and more than 50% of the area of the upper surface of the second semiconductor chip.

4. The semiconductor package of claim 1,
    wherein when the semiconductor package is viewed in a plan view, the stiffener has a fourth width in a second direction, perpendicular to the first direction, so as to cover at least 75% of the space between the first and second semiconductor chips.

5. The semiconductor package of claim 1, wherein the stiffener extends onto an upper surface of a peripheral portion of the second semiconductor chip, adjacent to an edge region of the substrate.

6. The semiconductor package of claim 1, wherein the stiffener substantially covers an entire upper surface of the second semiconductor chip.

7. The semiconductor package of claim 1, wherein the stiffener covers an upper surface of a peripheral portion of the first semiconductor chip, adjacent to an edge region of the substrate.

8. The semiconductor package of claim 1, wherein a thickness of the stiffener in a third direction perpendicular to the first surface of the substrate is less than 20% of a total thickness of the semiconductor package in the third direction.

9. The semiconductor package of claim 1, wherein the encapsulant covers at least a sidewall of each of the first semiconductor chip, the second semiconductor chip and the stiffener.

10. The semiconductor package of claim 1, wherein a portion of a lower surface of the stiffener on the space between the first semiconductor chip and the second semiconductor chip is higher than a bottom surface of each of the first semiconductor chip and the second semiconductor chip.

11. The semiconductor package of claim 10, wherein a portion of the encapsulant below the portion of the lower surface of the stiffener is in contact with sidewalls of the first and second semiconductor chips.

12. The semiconductor package of claim 1, wherein the first semiconductor chip is a logic chip, and the second semiconductor chip is a memory chip.

13. The semiconductor package of claim 1, wherein the second semiconductor chip includes a plurality of second semiconductor chips, and wherein the plurality of second semiconductor chips are disposed on opposite sides of the first semiconductor chip.

14. The semiconductor package of claim 13, wherein the stiffener includes a first stiffener and a second stiffener, and wherein the first stiffener and the second stiffener are on opposite sides, respectively, of the first semiconductor chip.

15. The semiconductor package of claim 1, further comprising a heat spreader on the stiffener.

16. The semiconductor package of claim 1, wherein the encapsulant contacts a side wall of the stiffener, an upper surface of the first semiconductor chip, and an upper surface of the second semiconductor chip.

17. The semiconductor package of claim 1, wherein the stiffener includes silicon.

18. A semiconductor package comprising:
a substrate having a first surface and a second surface, opposite to the first surface, and including a plurality of pads on the first surface thereof;
a first semiconductor chip disposed on the first surface of the substrate and electrically connected to a first group of pads among the plurality of pads;
a second semiconductor chip disposed on the first surface of the substrate, electrically connected to a second group of pads among the plurality of pads;
a stiffener covering at least a portion of an upper surface of the first semiconductor chip, at least a portion of an upper surface of the second semiconductor chip, and a space between the first semiconductor chip and the second semiconductor chip, and having a plate shape; and
an encapsulant disposed on the first surface of the substrate and covering at least portions of each of side walls of the first semiconductor chip, the second semiconductor chip, and the stiffener and at least portions of each of the upper surfaces of the first and second semiconductor chips,
wherein the encapsulant does not exist between the stiffener, the first and second semiconductor chips in a direction perpendicular to the first surface, and
wherein the stiffener has greater rigidity than the encapsulant.

19. A semiconductor package comprising:
a first substrate having opposite first and second surfaces, the first substrate including a plurality of first pads on the first surface thereof and a plurality of second pads on the second surface thereof electrically connected to the plurality of first pads;
a first semiconductor chip on the first surface of the first substrate, the first semiconductor chip connected to first portions of the plurality of first pads;
a second semiconductor chip on the first surface of the first substrate, the second semiconductor chip connected to second portions of the plurality of first pads;
a stiffener on the first semiconductor chip and the second semiconductor chip, the stiffener covering a space between the first semiconductor chip and the second semiconductor chip; and
an encapsulant on the first surface of the first substrate, the encapsulant covering a sidewall of the first semiconductor chip, a sidewall of the second semiconductor chip, and a sidewall of the stiffener,
wherein the stiffener has a planar area covering only portions of each of upper surfaces of the first semiconductor chip and the second semiconductor chip.

20. The semiconductor package of claim 19, further comprising a second substrate including upper pads, lower pads, and a redistribution layer connecting the upper pads and the lower pads,
wherein the first substrate is disposed on the second substrate,
wherein the plurality of second pads of the first substrate are connected to the upper pads of the second substrate.

* * * * *